(12) United States Patent
Finney

(10) Patent No.: US 6,778,366 B2
(45) Date of Patent: Aug. 17, 2004

(54) CURRENT LIMITING PROTECTION CIRCUIT

(75) Inventor: Adrian Finney, Oldham (GB)

(73) Assignee: Zetex PLC, Oldham (GB)

( * ) Notice: Subject to any disclaimer, the term of this patent is extended or adjusted under 35 U.S.C. 154(b) by 0 days.

(21) Appl. No.: 10/352,450

(22) Filed: Jan. 27, 2003

(65) Prior Publication Data

US 2003/0169025 A1 Sep. 11, 2003

(30) Foreign Application Priority Data

Jan. 25, 2002 (GB) .............................................. 0201817

(51) Int. Cl.$^7$ ............................................... H02H 7/10
(52) U.S. Cl. ........................................ 361/18; 323/315
(58) Field of Search ........................... 361/18; 323/312, 323/315, 277, 908

(56) References Cited

U.S. PATENT DOCUMENTS

| | | | |
|---|---|---|---|
| 4,612,497 A | | 9/1986 | Ulmer |
| 4,783,690 A | | 11/1988 | Walden et al. |
| 5,008,586 A | * | 4/1991 | Miyazaki et al. ........... 323/315 |
| 5,159,516 A | * | 10/1992 | Fujihira ....................... 361/18 |
| 5,570,060 A | * | 10/1996 | Edwards ..................... 327/541 |
| 5,973,367 A | | 10/1999 | Williams |
| 6,246,555 B1 | * | 6/2001 | Tham .......................... 361/18 |
| 6,285,177 B1 | | 9/2001 | Mallikarjunaswamy et al. |
| 6,452,766 B1 | * | 9/2002 | Carper ........................ 361/18 |
| 6,469,917 B1 | * | 10/2002 | Ben-Yaakov ................ 363/44 |

FOREIGN PATENT DOCUMENTS

| | | |
|---|---|---|
| JP | 5-343967 | 12/1993 |
| WO | WO 84/03181 | 8/1984 |

* cited by examiner

Primary Examiner—Adolf Berhane
(74) Attorney, Agent, or Firm—Morrison & Foerster LLP

(57) ABSTRACT

A current-limit circuit comprising a control transistor coupled to a power transistor in a current mirror configuration. A switch transistor is operatively coupled between the output of the power transistor and the control transistor to selectively activate the control transistor in response to an over current condition detected by a defect transistor. Current drawn through the power transistor in the over current condition is limited by the control transistor which is powered from the gate of the power transistor. The power and detect transistors are integrated on a semi-conductor substrate of a first conductivity type defining first and second surfaces. An array of adjacent transistor body regions of a second conductivity type provided adjacent said first surface with gate electrodes extending between adjacent body regions and insulated therefrom by a gate insulator layer. Transistor source regions of said first conductivity type are provided in said body regions adjacent said gate electrodes. Transistor source electrode material overlies the gate electrodes and is insulated therefrom by an insulation layer, the source electrode material contacting the source/body regions between adjacent gate electrodes. The source electrode layer is patterned to define first and second adjacent regions providing source contact to the power and detect transistors respectively. Electrodes of the power transistor are isolated from adjacent gate electrodes of the detect transistor by intervening body regions devoid of source regions adjacent one or both of said adjacent gate electrodes.

22 Claims, 2 Drawing Sheets

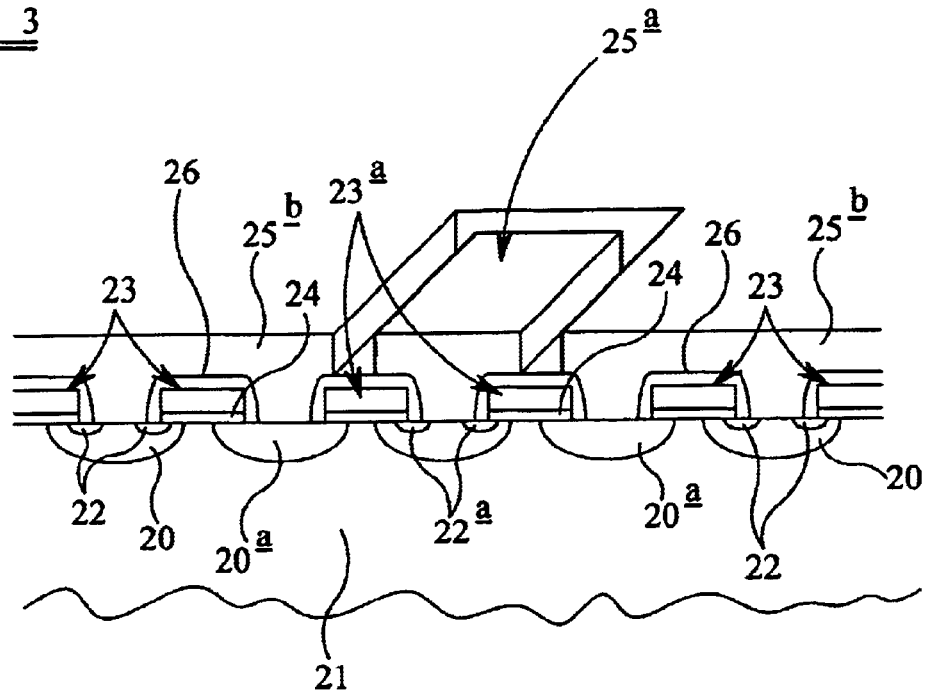
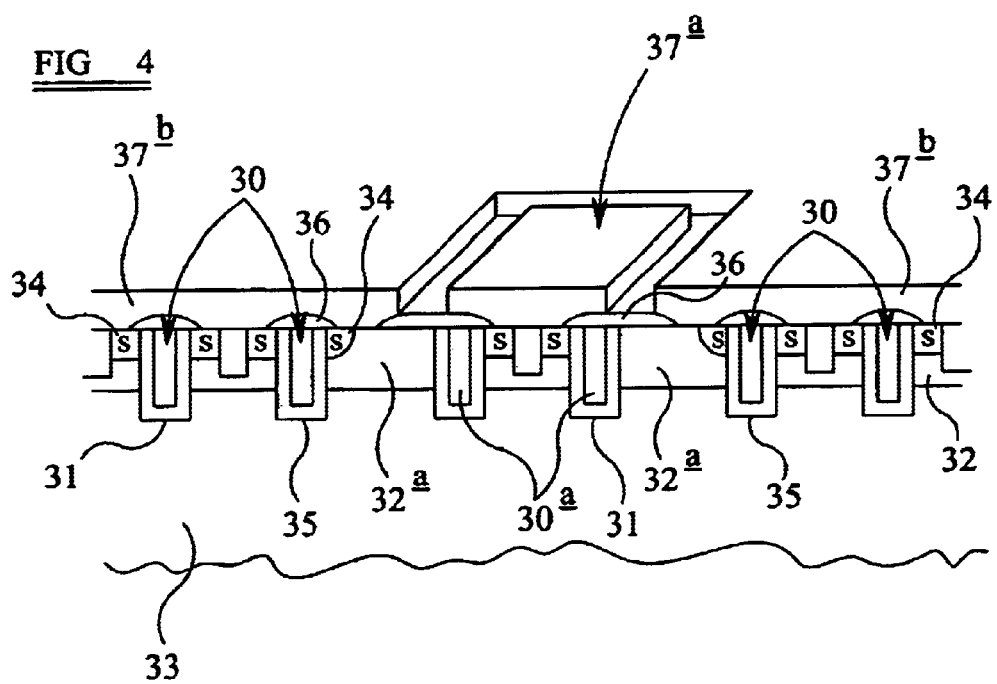

CURRENT LIMITING PROTECTION CIRCUIT

The present invention relates to a current limiting circuit for limiting the current flow through a power FET, such as a MOSFET or similar insulated gate transistor. In particular, the circuit prevents a potentially damaging current flowing through the power transistor in a short circuit or other over current condition.

Many electrical circuits comprising a power transistor driving a load include a current limiting circuit to limit the current drawn through the transistor, particularly in a short circuit condition, to prevent damage to the power transistor and/or load. One form of current limiting circuit widely used in bipolar transistor circuits is a current mirror. A current mirror essentially sinks a pre-determined current through a control transistor which limits the current through a power transistor to a multiple of the sink current in proportion to the ratio of the structural sizes of the two 'mirror' transistors. A power transistor may be a mirror transistor which is coupled to the output of the main drive transistor, or the main drive transistor may itself be the mirror transistor directly controlled by the control transistor.

Current mirrors have also been implemented to provide short circuit current protection for insulated gate transistors such as MOSFETs, although a different approach must be taken to that applied to bipolar transistors given the difference in structure. An example of a current limiting circuit for MOSFETs based on a current mirror configuration is described in U.S. Pat. No. 4,612,497. In this prior art circuit a current mirror comprising a pair of current mirror transistors, and a sink current transistor, are used to control the current through a drive transistor. The current mirror pair comprises a first control transistor and a much larger power transistor which is connected in series between the drive transistor and the output. The gates of the mirror transistors are coupled together so that the current flowing through the larger mirror transistor is controlled as a proportion of a sink current flowing through the control transistor and sink transistor. A disadvantage of this circuit is that the control transistor is always conducting and thus drawing power. This problem is addressed by U.S. Pat. No. 6,285,177.

U.S. Pat. No. 6,285,177 describes a current limiting circuit for a MOSFET in which a control transistor is only switched into conduction, to conduct an appropriate sink current, when a short circuit condition is detected. In this circuit the gate of the drive transistor is coupled to the gate of the control circuit so as to form one of the pair of current mirror transistors. The control transistor, which is much smaller than the power drive transistor, is coupled to an appropriate current source. A switching transistor is coupled in series between the control transistor and the output of the drive transistor (which is configured as a source follower). For normal operating conditions the switching transistor, and thus the control transistor, are non-conducting. However, in a short circuit condition the voltage at the output of the drive transistor, and thus switch transistor drops to zero (or near zero) which activities the switch transistor. The switch transistor in turn activates the control transistor into a conducting state. The predetermined sink current then flows through the control transistor with the result that the current drawn through the drive transistor is limited by the structural ratio of the control and drive transistors to a predetermined multiple of the sink current.

U.S. Pat. No. 6,285,177 further describes a semiconductor device structure in which the switch transistor and drive transistor can be integrated on the same device. The device has a cellular configuration and a minor portion of the drain cells are available for use either as drain cells of the main drive transistor or of the smaller switch transistor. The exact apportionment of cells is achieved by providing appropriately configured separate drain contact layers for the main drive transistor and the switch transistor.

A disadvantage of the above circuit is that it can only be implemented in a horizontal device, i.e. a device in which the drain and source regions are provided in the same (upper) surface of the device substrate. The circuit cannot be implemented in a more space efficient vertical structure in which the drain is provided on the opposite side of the substrate to the source regions and gate contacts. Furthermore, this prior art circuit can only be applied to a drive transistor operating in a high side application (e.g. configured as a source follower) whereas vertical MOSFETs are often used in low side applications (e.g. an N MOSFET with the output taken from the drain).

It is an object of the present invention to obviate or mitigate the above disadvantages.

According to a first aspect of the present invention there is provided a a current-limit circuit comprising:

a power transistor;

a control transistor coupled to the power transistor in a current mirror configuration and powered from the gate of the power transistor;

and switching circuitry operatively coupled between the output of the power transistor and the control transistor to selectively activate the control transistor in response to an over current condition, whereby current drawn through the power transistor in the over current condition is limited by the control transistor.

An advantage of the first aspect of the present invention is that no separate power supply is necessary for the control transistor of the current mirror since this derives its power directly from the gate signal supplied to the power transistor.

According to a second aspect of the present invention there is provided a current limit circuit comprising:

a power transistor;

a control transistor coupled to the power transistor in a current mirror configuration;

a switch transistor coupled in series with the control transistor; and a detect transistor operatively coupled between the power transistor and the switch transistor to activate the switch transistor in an over current condition detected at the output of the power transistor.

An advantage of the second aspect of the present invention is that the separate detect transistor provides a convenient means of connecting the switch transistor to the control transistor which is particularly useful when implementing the circuit in a vertical semi-conductor structure as described further below. Another advantage of the second aspect of the present invention in that the detect transistor provides a means of limiting the voltage passed to the switch transistor to prevent damage to the switch transistor in an over current condition.

The term "over current condition" refers to any condition in which the current rises above an acceptable level for normal operation of the device. A typical over current condition will be a short circuit condition but the invention is not limited to short circuit protection. For instance, the invention can be applied to limit the inrush current when driving inductive loads such as lamps, motors, car ignition coils etc. Other possible applications of the invention will be apparent to the skilled person.

According to a third aspect of the present invention there is provided a semi-conductor device having first and second insulated gate transistors integrated on a semi-conductor substrate of a first conductivity type defining first and second surfaces, comprising:

an array of adjacent transistor body regions of a second conductivity type provided adjacent said first surface;

gate electrodes extending between adjacent body regions and insulated therefrom by a gate insulator layer;

transistor source regions of said first conductivity type provided in said body regions adjacent said gate electrodes;

transistor source electrode material overlying the gate electrodes and insulated therefrom by an intervening insulation layer, said source electrode material contacting said source/body regions between adjacent gate electrodes;

wherein the source electrode layer is patterned to define first and second adjacent regions providing source contact to the first and second transistors respectively; and gate electrodes of the first transistor are isolated from adjacent gate electrodes of the second transistor by intervening body regions devoid of source regions adjacent one or both of said adjacent gate electrodes.

The structure according to the third aspect of the present invention enables integration of a power transistor and detect transistor on a single substrate whilst isolating the source and gate contacts of one transistor from the other. Furthermore, the structure allows the device to be implemented in an efficient planar or trench vertical structure.

Other objects and advantages of the various aspects of the present invention will become apparent from the following description.

Specific embodiments of the present invention will now be described, by way of example only, with reference to the accompanying drawings, in which:

FIG. 3 illustrates a semi-conductor device in accordance with the present invention; and FIG. 4 illustrates a further semi-conductor device in accordance with the present invention.

Figure 1:
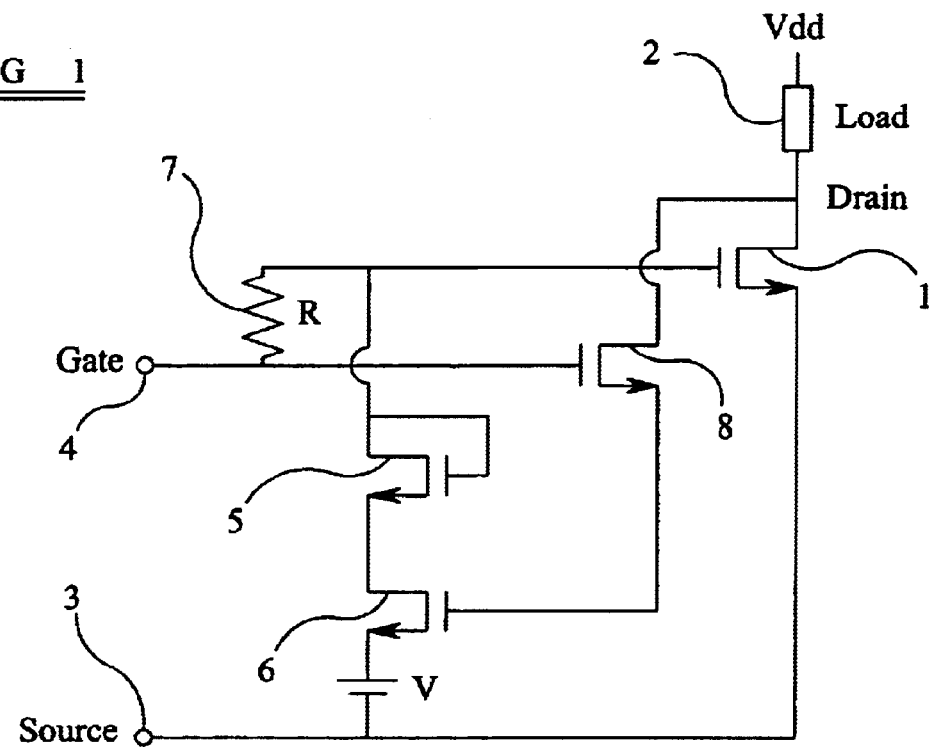
FIG. 1 illustrates a circuit in accordance with a first embodiment of the present invention.

Referring first to FIG. 1, this shows a current limiting circuit for protecting a power transistor 1 driving a load 2 powered by a supply voltage $V_{dd}$ in a low side application. In this circuit all of the transistors are N channel MOSFETs but it will be appreciated that the circuit can be implemented using P channel MOSFETs simply by reversing the polarities etc. In the illustrated example the output is at the drain of the drive transistor 1, the source of the drive transistor 1 is connected to a source terminal 3, and the gate contact is connected to a gate terminal 4.

A diode configured current limiting control transistor 5 is coupled in series between the gate terminal 4 and the source terminal 3 and has its gate coupled to the gate of the drive transistor so that the drive transistor 1 and control transistor 5 together form a current mirror pair.

The conducting/non-conducting state of the control transistor 5 is itself controlled by a switch transistor 6 coupled in series between control transistor 5 and the source terminal 3. A resistor 7 is connected in series between the gate terminal 4 and the drain of the control transistor 5 and an optional off-set voltage V is connected in series between the source of the switch transistor 6 and the source terminal 3.

Finally, a detect transistor 8 is coupled between the output of the drive transistor 1 and the switch transistor 6. That is, the drain of the detect transistor 8 is connected to the drain of the drive transistor 1, and the source of the detect transistor 8 is connected to the gate of the switch transistor 6. The gate contact of the detect transistor 8 is connected to the gate terminal 4.

Operation of the circuit will now be described:

When the signal at the gate terminal is low, none of the transistors will be conducting and thus no current will flow through any part of the circuit.

When the signal on the gate terminal is high and the load is operating normally, only the drive transistor 1 will be conducting. Neither switch transistor 6 nor control transistor 5 will draw any current. This is because switch transistor 6 will only be activated into a conducting state when its $V_{gs}$ exceeds its gate threshold voltage $V_{TH}$, which requires voltage at the drain of the drive transistor 1 to be greater than $V+V_{TH}$. This should not occur under normal operation.

In a short circuit condition the voltage at the drain of the drive transistor 1 will rise rapidly to $V_{dd}$. In the absence of any limiting protection, this would cause a large and potentially damaging power dissipation leading to overheating of the drive transistor 1. However, as soon as the drain voltage of the drive transistor 1 reaches $V+V_{TH}$ the switch transistor 6 will become conducting and a sink current will then be drawn through the control transistor 5, powered by the voltage at the gate terminal 4 and predetermined by the size of the resistor 7. The current flowing through the drive transistor 1 is thus immediately limited to a multiple of the sink current pre-determined by selection of the structural ratio of the drive transistor 1 and the control transistor 5. In a typical circuit the drive transistor 1 may be of the order of 10000 times or so of the size of the control transistor 5. For example, the circuit can be designed so that a 100 $\mu A$ through the control conductor 5 will limit the current flow through the drive transistor 1 to 1A.

In addition to drawing no drain current except during a short circuit condition, the above described circuit in accordance with the present invention has a number of advantageous features. For instance the short circuit protection is only activated when the drain voltage of the drive transistor 1 exceeds $V+V_{TH}$ (where $V_{TH}$ is the threshold voltage of the switch transistor 6) and can readily be predetermined by selection of an appropriate offset voltage V. In addition, the short circuit protection will not prevent large currents flowing through the drive transistor at low drain voltages which is useful in many applications such as when the drive transistor is starting an inductive or a capacitive load. There is no compromise of the $R_{ds}$on when the drive transistor is operating normally.

The control transistor 5 is powered by the voltage supplied to the gate terminal 4, no separate contact is required which is a significant advantage. Furthermore, the level of the sink current, and hence the power dissipated in a short circuit condition, is readily adjusted by appropriate selection of the value of the resistor 7. This can be made available externally through provision of only one extra pin to a semi-conductor device implementing the circuit since the gate connection of the power transistor 1 is already externally available.

A further advantage of the above circuit is that it can be readily implemented in a vertical MOSFET structure appropriate to many low side applications. In this regard, use of a separate detect transistor 8, distinct from the switch transistor 6, enables a ready coupling of the drain of the drive transistor 1 to the gate of the switch transistor 6 (i.e.

the gate of the switch transistor 6 is connected to the source of the detect transistor 8 both of which are located on the same side of the semi-conductor device). The detect transistor 8 also serves a further important function in preventing the gate voltage at the switch transistor 6 from exceeding its gate rupture voltage. This is because the source of detect transistor 8 can never rise above the voltage at the gate terminal 4 minus the threshold voltage of the detect transistor 8. In other words, as the voltage at the drain of the drive transistor 1 increases it is fed through to the gate of the switch transistor 6 until it reaches this maximum limit.

It will be appreciated that many modifications could be made to the circuit described above to suit particular applications and to provide enhancements where necessary. For example, it would be beneficial to connect a resistor from the gate of the switch transistor 6 to a lower potential to improve the turn of the short circuit protection. An example of an enhancement to the circuit described above is for instance illustrated in FIG. 2.

Figure 2:
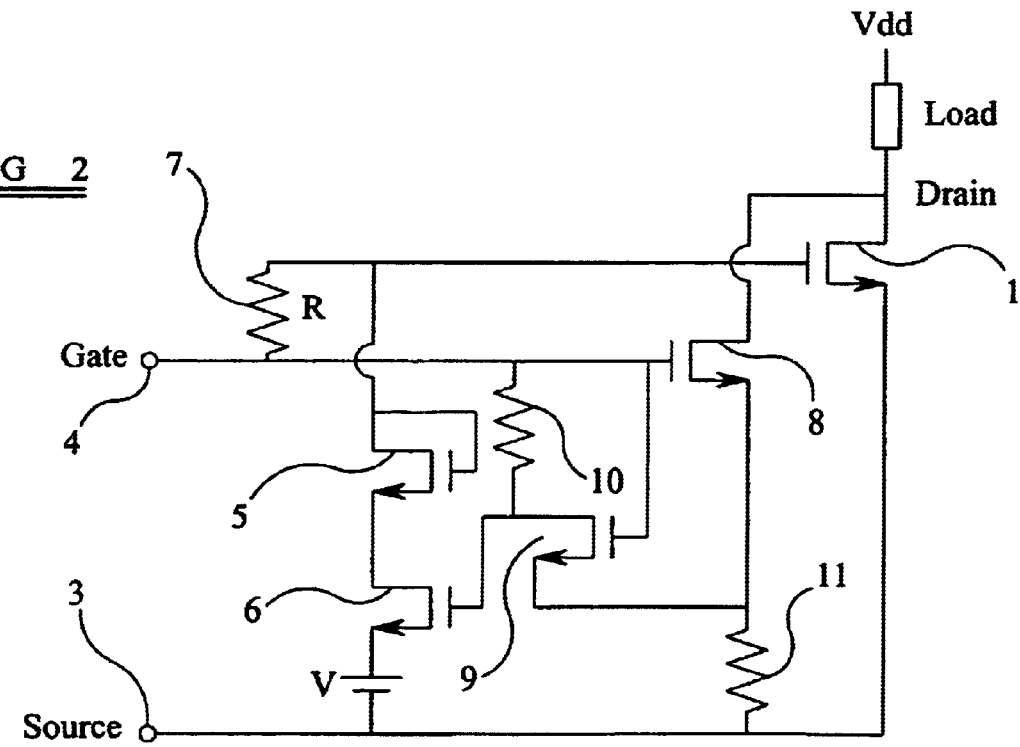
FIG. 2 illustrates a circuit in accordance with a second embodiment of the present invention.

Referring to FIG. 2, this illustrates a modification of the circuit of FIG. 1 which effectively introduces extra gain into the circuit so that it will operate at very low gate drives. The modification comprises a MOSFET 9 connected in series between the gate terminal 4 and the source terminal 3 via resistors 10 and 11 respectively. The gate of the additional transistor 9 is coupled to the gate terminal 4. In this modification the source of the detector transistor 8 is no longer connected directly to the gate of the switch transistor 6 but rather is connected to the source of the additional transistor 9 which in turn has its drain coupled to the gate of switch transistor 6. The additional transistor 9 will be integrated into the device so that its body is fixed at ground potential, with the result that as its source potential rises its threshold voltage relative to the source will also rise—this is known as the 'body effect'. The circuit is designed to take advantage of this body effect to activate the switch transistor 6 at relatively low voltages and in particular low gate drives.

For instance, if the threshold voltage of all of the transistors in the circuit is 1.5V and a 3V gate voltage is applied, a voltage of 1V at the drain transistor 1 will raise the threshold voltage of the additional transistor 9 to 2V (the transistor 9 will be non-conducting). The effect of this is that the gate of the switch transistor 6 will be at 3V rather than 1V and the current mirror will be activated.

Other possible modifications and enhancements to the basic short circuit protection circuit of the present invention will be readily apparent to the appropriately skilled person. For instance, the invention can be applied to an IGBT device simply by replacing the drive MOSFET 1 and the detect MOSFET 8 with corresponding IGBTs. The other components can remain unchanged.

As mentioned above, in addition to the suitability of the present invention to low side applications, the present invention has the advantage that it can be readily implemented in a vertical transistor. In a preferred device structure the detect transistor 8 is integrated with the drive transistor 1. For a horizontal structured transistor the main transistor requires a larger area than a vertical embodiment if it is to be capable of supporting above around 12V. FIG. 3 illustrates a preferred way in which the detect transistor 8 can be formed in the active region of the drive transistor 1.

Referring to FIG. 3, this is a cross-section through the upper part of the active region of a vertical MOSFET of a planar striped configuration. Assuming the MOSFET is an N MOSFET, P-type body regions 20 are formed in the upper surface of an N-type substrate 21 which provides a drain/drift region of the device. It will be appreciated that an N+ drain region will be formed on the lower surface of the substrate (not shown) together with an appropriate drain contact. N-type source regions 22 are provided in the upper surface of the substrate within the body regions 20. Gate electrodes 23 extend between adjacent body regions, overlying the drift drain region 20 and overlapping adjacent source regions 22, and isolated from the sources/body/drift regions by gate insulator 24. Source contact material 25 overlies the structure contacting source regions 22 in between adjacent gate electrodes 23 and separated from the gate electrodes 23 by suitable isolation material 26. A conventional drain region and contact (not shown) will be provided on the lower (reverse) side of the substrate.

As so far described, the device is entirely conventional and the skilled person will readily appreciate the different materials and manufacturing methods that can be used to produce basic structure.

To implement the detect transistor and drive transistor on the same substrate, an appropriate number of source regions 23a are simply isolated from the bulk of the source regions by appropriate patterning of the source contact layer 25. This basic method is taught for instance in U.S. Pat. No. 4,783,690. This enables separate source connections to be made to the detect transistor and main drive transistor as illustrated at 25a and 25b respectively. However, with the circuit according to the present invention the detect transistor requires its own gate contact, separate from the gate contact of the main drive transistor, in order to implement the resistor 7 (or any other means for generating the sink current required to set the level of the current limit). This is achieved in the present invention simply by leaving some body regions 20a without any source regions to isolate gate electrodes 23a of the detect transistor from gate electrodes 23 of the main drive transistor. This is a particularly advantageous approach since it requires no additional process steps, rather this can be achieved by appropriate modification of the masks used when the source regions 22/22a are formed.

The illustrated structure is a stripe configuration but it will be appreciated that the same principals can be applied to a conventional cellular configuration.

Similarly, this aspect of the invention can be implemented in a trench MOSFET structure as illustrated in FIG. 4. Referring to FIG. 4, this is the cross section through the upper surface of the active region of a vertical trench MOSFET design, in which the gate electrode material 30 is provided in trenches 31 in a body region 32 formed in the upper surface of a substrate 33 which provides a drift/drain region as for the structure of FIG. 3. As with any other conventional trench structure, source regions 34 are formed in the upper surface of the body region 32 adjacent the trenches 31 and separated from the gate electrode material 30 by an appropriate gate insulator 35 lining the trench walls. Gate electrode material 31 is isolated from the overlying source metalisation by isolation regions 36.

The source regions 37a of the detect transistor are isolated from the source regions 37 of the drive transistor by appropriate patterning of source contact material exactly as described above in relation to FIG. 3. Similarly, the gate electrodes 30a of the detect transistor 38 are isolated from those of the power transistor by omitting source regions from the body region 32a separating the two transistors.

As mentioned above, the present invention can be implemented with any insulated gate power transistor structure, including n-channel MOSFETs, p-channel MOSFETs and corresponding IGBTs. For instance, the semi-conductor structures illustrated in FIGS. 3 and 4 can readily be modified to provide corresponding planar and vertical IGBT structures simply by providing a further semi-conductor layer beneath the substrate and of the opposite conductivity type.

It will be appreciated that the switch transistor, control transistor, and any other transistors such as the additional transistor 9, can readily be implemented on the same chip as the drive transistor and detect transistor in accordance with conventional semi-conductor device fabrication techniques. Accordingly, no attempt will be made here to describe a complete device integrating all of the elements of the circuit.

It will also be appreciated that whilst integration in a single semi-conductor device will generally be preferred, the short circuit protection circuit of the present invention could also be implemented by discrete devices.

It will further be appreciated that whilst it is convenient to use a resistor to set the level of current drawn by the control transistor 5 in a short circuit condition, other current sources could be used.

Further possible modifications and applications of the present invention will be readily apparent to the appropriate skilled person.

What is claimed is:

1. A current-limit circuit comprising:
   a power transistor;
   a control transistor coupled to the power transistor in a current mirror configuration and powered from the gate of the power transistor; and
   switching circuitry operatively coupled between the output of the power transistor and the control transistor to selectively activate the control transistor in response to an over current condition, whereby current drawn through the power transistor in the over current condition is limited by the control transistor.

2. A current-limit circuit according to claim 1, wherein the drain of the control transistor is coupled to the gate of the power transistor and the source of the control transistor is coupled to the source of the power transistor.

3. A current limit circuit according to claim 1, wherein the switching circuitry comprises a switching transistor coupled in series with the control transistor.

4. A current limit circuit according to claim 3, wherein the switch transistor is coupled to the drain of the power transistor in order to become conducting when the voltage at the output of the power transistor rises above a threshold level.

5. A current limit circuit according to claim 4, wherein the switch transistor is coupled to the output of the power transistor via a detect transistor.

6. A current limit circuit according to claim 5, wherein the drain of the detect transistor is coupled to the drain of the power transistor, the source of the detect transistor is coupled to the gate of the switch transistor, and the gate of the detect transistor is coupled to the gate terminal of the circuit.

7. A current limit circuit according to claim 1, wherein a resistance is connected in series between the gate terminal of the circuit and the drain of the control transistor.

8. A current limit circuit according to claim 7, wherein the resistance is coupled between separate gate contacts of the power transistor and detect transistor.

9. A current limit circuit according to claim 6, wherein the detect transistor is coupled to the switch transistor via a further transistor having its source coupled in series with the source of the detect transistor and its drain coupled to the gate of the switch transistor.

10. A current limit circuit comprising:
    a power transistor;
    a control transistor coupled to the power transistor in a current mirror configuration;
    a switch transistor coupled in series with the control transistor; and
    a detect transistor operatively coupled between the power transistor and the switch transistor to activate the switch transistor in an over current condition detected at the output of the power transistor.

11. A current limit circuit according to claim 10, wherein the drain of the detect transistor is coupled to the drain of the power transistor and the source of the detect transistor is coupled to the gate of the switch transistor so that voltage rises at the drain of the power transistor are passed to the gate of the detect transistor up to a limit equalling the difference between the gate voltage of the detect transistor and the threshold voltage of the detect transistor.

12. The circuit of claim 10, wherein the detect transistor and the power transistor are structurally integrated into a single semi-conductor device.

13. A circuit according to claim 12, wherein the semi-conductor device is a vertical FET or IGBT with a drain contact on a back surface of the device.

14. A power semi-conductor device having first and second insulated gate transistors integrated on a semi-conductor substrate of a first conductivity type defining first and second surfaces, comprising:
    an array of adjacent transistor body regions of a second conductivity type provided adjacent said first surface;
    gate electrodes extending between adjacent body regions and insulated therefrom by a gate insulator layer;
    transistor source regions of said first conductivity type provided in said body regions adjacent said gate electrodes;
    transistor source electrode material overlying the gate electrodes and insulated therefrom by an insulation layer, said source electrode material contacting said source/body regions between adjacent gate electrodes;
    wherein the source electrode layer is patterned to define first and second adjacent regions providing source contact to the first and second transistors respectively; and
    gate electrodes of the first transistor are isolated from adjacent gate electrodes of the second transistor by intervening body regions devoid of source regions adjacent one or both of said adjacent gate electrodes.

15. A semi-conductor device according to claim 14, wherein said gate electrodes overly said first surface of the substrate.

16. A semi-conductor device according to claim 14, wherein said gate electrodes are formed in trenches which extend from said first surface of the substrate through said body regions.

17. A semi-conductor device according to claim 14, wherein said source regions are formed adjacent said first surface.

18. A semi-conductor device according to claim 14, wherein said first transistor is a power transistor.

19. A semi-conductor according to claim 18, wherein said second transistor is substantially smaller than said first transistor, and said second source electrode region is formed adjacent a periphery of the active region of the device defined by said body/source regions.

20. A semi-conductor device according to claim 14, wherein the first and second transistors are MOSFETs or IGBTs.

21. A semi-conductor device according to claim 14, wherein said first and second transistors have a common drain contact provided on said second surface of the substrate.

22. A current limit circuit comprising:
- a power transistor;
- a control transistor coupled to the power transistor in a current mirror configuration;
- a switch transistor coupled in series with the control transistor; and
- a detect transistor operatively coupled between the power transistor and the switch transistor to activate the switch transistor in an over current condition detected at the output of the power transistor;
- and wherein the power transistor and detect transistor are insulated gate transistors integrated on a semiconductor substrate of a first conductivity type defining first and second surfaces, and comprising:
- an array of adjacent transistor body regions of a second conductivity type provided adjacent said first surface;
- gate electrodes extending between adjacent body regions and insulated therefrom by a gate insulator layer;
- transistor source regions of said first conductivity type provided in said body regions adjacent said gate electrodes;
- transistor source electrode material overlying the gate electrodes and insulated therefrom by an insulation layer, said source electrode material contacting said source/body regions between adjacent gate electrodes;
- the source electrode layer being patterned to define first and second adjacent regions providing source contact to the power and detect transistors respectively; and
- gate electrodes of the power transistor are isolated from adjacent gate electrodes of the detect transistor by intervening body regions devoid of source regions adjacent one or both of said adjacent gate electrodes.

\* \* \* \* \*